(12) United States Patent
Gabriel et al.

(10) Patent No.: US 6,599,839 B1
(45) Date of Patent: Jul. 29, 2003

(54) PLASMA ETCH PROCESS FOR NONHOMOGENOUS FILM

(75) Inventors: Calvin T. Gabriel, Cupertino, CA (US); Lynne A. Okada, Sunnyvale, CA (US); Dawn M. Hopper, San Jose, CA (US); Suzette K. Pangrle, Cupertino, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 121 days.

(21) Appl. No.: 09/773,906

(22) Filed: Feb. 2, 2001

(51) Int. Cl.$^7$ ............................................. H01L 21/302
(52) U.S. Cl. ...................... 438/705; 438/706; 438/709; 438/714; 438/723; 438/725
(58) Field of Search ................................ 438/705, 706, 438/709, 714, 723, 725

(56) References Cited

U.S. PATENT DOCUMENTS

| | | | |
|---|---|---|---|
| 4,756,977 A | | 7/1988 | Haluska et al. |
| 5,866,930 A | * | 2/1999 | Saida et al. .................. 257/316 |
| 5,981,354 A | | 11/1999 | Spikes et al. |
| 6,273,954 B2 | * | 8/2001 | Nishikawa et al. .......... 118/692 |
| 6,322,714 B1 | * | 11/2001 | Nallan et al. .................. 216/67 |
| 6,337,151 B1 | * | 1/2002 | Uzoh et al. .................. 428/698 |
| 6,346,490 B1 | * | 2/2002 | Catabay et al. .............. 438/795 |

\* cited by examiner

Primary Examiner—Benjamin L. Utech
Assistant Examiner—Binh X. Tran

(57) ABSTRACT

A composite layer comprising a non-homogenous layer is etched by continuously varying a process parameter, such as the amount of reactive agent in an etchant mixture. Embodiments include etching a silicon oxide film having a varying concentration of carbon through the film with an etchant mixture containing a fluorinated organic, oxygen and an inert gas and continuously increasing and/or decreasing the amount of oxygen in the etchant mixture during etching through the silicon oxide film.

13 Claims, 4 Drawing Sheets

PLASMA ETCH PROCESS FOR NONHOMOGENOUS FILM

TECHNICAL FIELD

The present invention relates to a method of manufacturing a semiconductor device comprising patterning a multi-layered structure by etching. The present invention is particularly applicable to accurately etch though non-homogenous films thereby patterning features for high-density semiconductor devices having a design rule of about $0.18\mu$ and under.

BACKGROUND ART

Fabrication of semiconductor devices begins with providing a semiconductor substrate, usually of doped monocrystalline silicon, and employs film formation, ion implantation, photolithographic, etching and deposition techniques to form various structural features in or on the semiconductor substrate to attain individual circuit components. The features and devices are then interconnected to ultimately form an integrated semiconductor circuit by a plurality of sequentially formed inter-metal dielectric layers and electrically conductive patterns. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate.

A commonly employed method for forming conductive plugs for electrically interconnecting vertically spaced metallization levels is known as "damascene"-type processing. Generally, this process involves forming a via opening in the inter-metal dielectric layer or inter-layer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical-mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

The dielectric constant of materials currently employed in the manufacture of semiconductor devices for an ILD ranges from about 3.9 for dense silicon dioxide to over 8 for deposited silicon nitride. One type of ILD material that has been explored is a group of flowable oxides, such as hydrogen silsesquioxane (HSQ) or methyl silsesquioxane (MSQ). Such polymers and their use are disclosed in, for example, U.S. Pat. No. 4,756,977 and U.S. Pat. No. 5,981, 354. HSQ-type flowable oxides have been considered for gap filling between metal lines because of their flowability and ability to fill small openings. HSQ-type flowable oxides have been found to be vulnerable to degradation during various fabrication steps, including plasma etching.

In fabricating the various semiconductor devices and their integration, it is conventional to employ layers having a concentration variation of one or more components through the layer as, for example, a doped polysilicon layer having a high concentration of dopant near its surface in the formation of a source/drain region or conductive feature. Other common non-homogenous films employed in the manufacture of device layers result from the intended or unintended variation of components in the film as, for example, in the formation of low dielectric constant (low-k) materials useful as interlayer dielectrics.

In etching such non-homogenous layers, the prior art has either ignored the variation of components through the subject layer or employed discrete etching steps, such as the addition of an additional etching component or a discrete change in the concentration of the etchant. However, it would be highly advantageous to develop etching processes that would compensate for the non-homogenous nature of layers that are employed in the fabrication of semiconductor devices or features. It would also be highly advantageous to develop a methodology capable of etching conventional layers employing the same basic etch chemistry to minimize processing variations.

SUMMARY OF THE INVENTION

An advantage of the present invention is a method of etching a non-homogenous layer on a semiconductor substrate by continuously varying at least one parameter during etching of the layer to correspond to concentration variations of a non-homogenous layer thereby improving the accuracy and throughput of the etching process.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of etching a non-homogenous film on a semiconductor substrate. The method comprises: forming a non-homogenous layer having a varying concentration of at least one element through the layer on the semiconductor substrate. In an embodiment of the present invention, the non-homogenous layer can comprise a silicate glass layer having a varying carbon concentration through the layer. The silicate glass can be formed on a conductive layer and perform as an interlevel dielectric.

The method continues by etching the non-homogenous layer with an etchant having a reactive agent while continuously varying at least one etch process parameter, such as varying the concentration of the reactive agent in the etchant to correspond to the concentration of the at least one element in the layer during etching through the non-homogenous layer. The present invention advantageously varies the amount of a given agent in an etchant mixture to loosely correspond to the relative amount of a particular component that varies through a non-homogenous layer thereby improving etching accuracy and throughput of non-homogenous layer.

Another aspect of the present invention is a method of etching a composite layer comprising a conductive layer and a silicon oxide film thereon. The method comprises: forming a silicon oxide film having a varying concentration of carbon through the film; forming a layer of photoresist material on the silicon oxide film; patterning the photoresist layer to form a photoresist mask having at least one opening; and using the photoresist mask, etching the silicon oxide film with an etchant having a reactive agent by continuously varying the concentration of the reactive agent in the etchant to correspond to the concentration of the carbon through the film during etching. Advantageously, the present invention improves the etching of non-homogenous ILD layers employed in the formation of interconnects.

Additional advantages of the present invention will become readily apparent to those having ordinary skill in the art from the following detailed description, wherein the embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention enables the production of semiconductor devices with improved product yield by providing a more accurate etching process that loosely matches concentration variation in a non-homogenous layer. The present invention strategically achieves improvements in etching by continuously varying an etch process parameter, such as by continuously varying the flow rate or concentration of one or more reactive agents in the etchant used in etching the non-homogenous layer. Other process parameters that can be continuously varied during etching include power and/or pressure.

Practice of the present invention can be illustrated with reference to several embodiments described with the aid of the following figures. The embodiments illustrated herein are for illustrative purposes only and should not be construed to limit the scope of the claims. As is clear to one of ordinary skill in the art, the instant disclosure encompasses a wide variety of embodiments not specifically illustrated herein.

Figure 1:
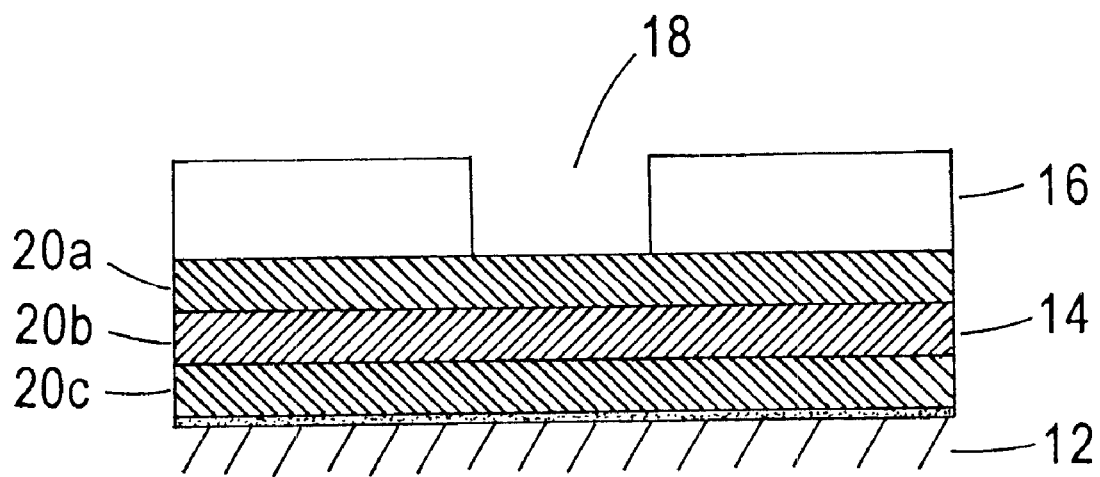
FIG. 1 is a cross-sectional view schematically depicting a composite structure according to an embodiment of the present invention.

Referring to FIG. 1, a composite arrangement of the present invention is illustrated prior to etching. The composite arrangement comprises patterned photoresist layer 16 overlying non-homogenous layer 14 formed on a semiconductor substrate 12. Although not specifically illustrated in FIG. 1, conventional integrated circuit contain field isolation and active electrical devices (e.g., capacitors, MOSFETs, bipolar devices, diodes, logic gates, etc.) over the surface of the starting substrate material. These layers are contemplated in the present invention and inherently and collectively included as substrate 12 in FIG. 1. These active devices formed over the substrate are interconnected by semiconductive layers such as polysilicon, amorphous silicon, or salicided regions. In the alternative, these active circuits may also be interconnected by metallic interconnects or some combination of semiconductive interconnects and metallic interconnects. Suitable semiconductor substrates include typical substrates used in the fabrication of integrated circuits, such as doped monocrystalline silicon, gallium, germanium, amorphous silicon, or gallium-arsenide substrates.

In an embodiment of the present invention, substrate 12 in FIG. 1 comprises a composite structure including a semiconductor substrate, a conductive layer, e.g. a metal layer, thereon and a layer 14 over the conductive layer as in the formation of an interconnect composite. In the formation of devices and metallization layers, a patterned photoresist containing several thousand openings is typically formed. Patterned photoresist layer 16 can be formed by depositing, e.g. spin coating, a radiation sensitive photoresist onto layer 14 and imagewise exposing the applied photoresist followed by developing the exposed photoresist to form the patterned photoresist layer having at least one opening (i.e. a via or trench) 18 therein extending to the surface and exposing underlying layer 14.

In accordance with the present invention, layer 14 is a non-homogenous layer, i.e. a layer comprising at least one component that varies in amount from the top surface to the bottom surface of the layer, i.e. through the layer. In an embodiment of the present invention, layer 14 is a non-homogenous dielectric layer, e.g. an organosilicate glass such as a methyl silsesquioxane (MSQ), hydrogen silsesquioxane (HSQ), etc. used to electrically isolate conductive features, such as metal lines and plugs, as in the formation of an interconnect composite structure.

Organosilicate glasses comprise various amounts of hydrogen, carbon, silicon and oxygen in an amorphous polymeric form and can be deposited by CVD or spin-coating techniques, for example. Following deposition of the organosilicate layer, spin-coated materials are conventionally thermally cured at temperatures between about 400° C. to 500° C. During application and subsequent processing of the organosilicate material, however, some of the Si—C bonds can be replaced by hydroxyl groups on the surfaces of the material and variations in the concentration of carbon and/or hydrogen through the organosilicate glass has been observed.

Alternative dielectric materials which may offer promise for use as dielectric layers in the formation of an ILD are several organic low-k materials, typically having a dielectric constant of about 2.0 to about 3.8. Organic low-k materials which offer promise are carbon-containing dielectric materials such as FLARE 20™ dielectric, a poly(arylene) ether, available from Allied Signal, Advanced Micromechanic Materials, Sunnyvale, Calif.; BCB (divinylsiloxane bisbenzocyclobutene) and SiLK™ dielectric, an organic polymer similar to BCB, both available from Dow Chemical Co., Midland, Mich.; organic doped silica glasses (OSG) (also known as carbon doped glasses) including Black-Diamond™ dielectric available from Applied Materials, Santa Clara, Calif., Aurora™ dielectric available from ASM America, Inc., Phoenix, Ariz., and Coral™ dielectric available from Novellus, San Jose, Calif.; and JSR LKD (Japanese Synthetic Rubber Co. Low K Dielectric) a family of low density MSQ films.

In an embodiment of the present invention, layer 14 comprises an organosilicate glass material having low carbon content in region 20a, e.g. about 8 mole percent of carbon, a moderate carbon content in region 20b, e.g. about 12%, and a high content in region 20c, e.g. 16%. In another embodiment of the present invention, layer 14 comprises an organosilicate glass material having low carbon content in region 20a, e.g. 8%, a high carbon content in region 20b, e.g. 16%, and again a low carbon content in region 20c, e.g. 8%.

As described above, the in-homogeneity can be unintentional or intentional as with the formation of a multi-layered dielectric layer. For example, suitable ILD layers are fluorine doped silica glasses (FSG). FSG include dielectrics formed from precursor gases $SiF_4$ and $O_2$ and dielectrics formed from the precursors $SiF_4$ and tetraethylorthosilicate (TEOS). Dielectrics formed from TEOS and $SiF_4$ are known as fluorinated TEOS or FTEOS. FSGs typically exhibit a dielectric constant to about 3.6. It is believed that fluorine lowers the dielectric constant of silicon oxide films because fluorine is an electronegative atom that decreases the polarizability of the overall SiOF network. In an embodiment of the present invention, the multi-layered dielectric can be formed by depositing a lower layer of an organic doped silica glass on a semiconductor substrate; depositing a middle layer comprising a mixture of a fluorine doped silica glass and then gradually increasing the concentration of carbon to form an upper layer of the silica glass having a high carbon content, e.g. form a high carbon content upper layer of the silica glass.

Alternatively, the non-homogenous layer can be a doped silicon layer, e.g. a phosphorous or boron doped source/drain region, or any other layer in the fabrication of a semiconductor device or integration thereof that has one or more components that vary through the layer.

In practicing the present invention, a composite structure having an exposed non-homogenous layer, such as that illustrated in FIG. 1, is placed in an etching chamber and the non-homogenous layer is etched to transfer the photoresist pattern to the non-homogenous layer. In general, etchants comprise several components including a general component that etches the bulk of the material. Additional reactive agents are added to the etchant composition to enhance the etching of film additives, e.g. to increase etch rates. The added agents are generally added to react or etch the varying component in the non-homogenous layer but can also be employed to etch the bulk material as well. For example, oxygen can be added to a fluorocarbon etch recipe when etching a silicate glass layer to improve the etching of carbon in the layer. Chlorine and/or inorganic acids can be varied in a polysilicon etch recipe to compensate for a higher concentration of dopant on the top surface of a doped polysilicon during etching of the doped polysilicon.

In accordance with the present invention, an etch process parameter, such as the amount or flow rate of an active agent in the etchant composition is continuously changed during the time that the non-homogenous film is being etched. Continuously changing the amount of the active agent in the etchant to loosely match the concentration or relative amount of the varying component in the non-homogenous layer improves the etching process.

In an embodiment of the present invention, etching of a non-homogenous dielectric film, e.g. an organosilicate glass film over a conductive layer on a semiconductor substrate, is carried out by placing the semiconductor substrate having the film into a commercially available plasma etch tool (e.g. a TEL DRM (Tokyo Electron, Limited Dipole Ring Magnetron) made by Tokyo Electric Ltd.) and conditioning the etch chamber. The chamber pressure is maintained at about 20 mTorr to about 800 mTorr and the tool power set at about 400 Watts (W) to about 2,000 W. The temperature of the substrate is maintained at about −20° C. to about 80° C. The total gas inlet flow is maintained at about 50 standard cubic centimeters per minute (sccm) to about 2,000 sccm.

Typical etchants for etching an organosilicate glass include a fluorinated organic (e.g. $C_4F_8$, $C_5F_8$, $CHF_3$, $C_2F_6$, $CF_4$, etc.) together with an inert gas (e.g. argon). Active agents such as oxygen can be added to enhance the etching of carbon contained in the dielectric. The amount of oxygen added should be roughly proportional to the amount of carbon in the film at any given time during the etching process. Since the carbon content varies continuously rather than in discrete steps, then the reactive oxygen employed in etching the film should also vary continuously.

Figure 2A:
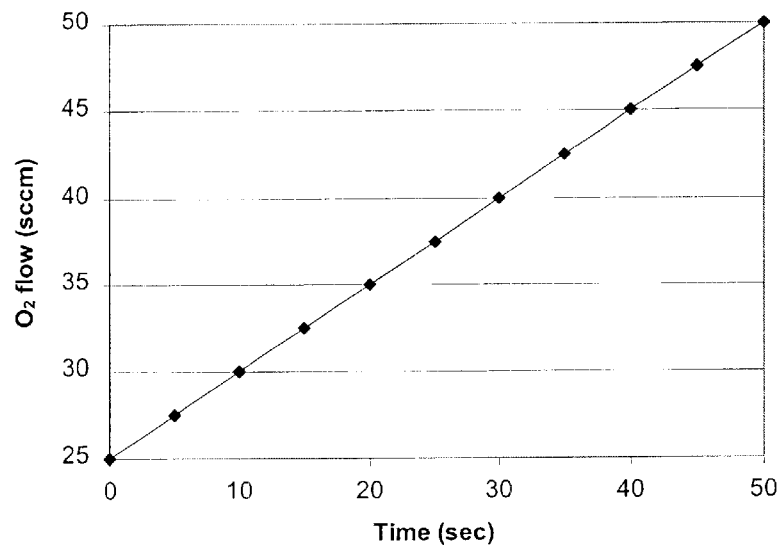
FIGS. 2–4 are graphs illustrating several embodiments for varying a reactive agent during etching a layer in accordance with the present invention.
Figure 2B:
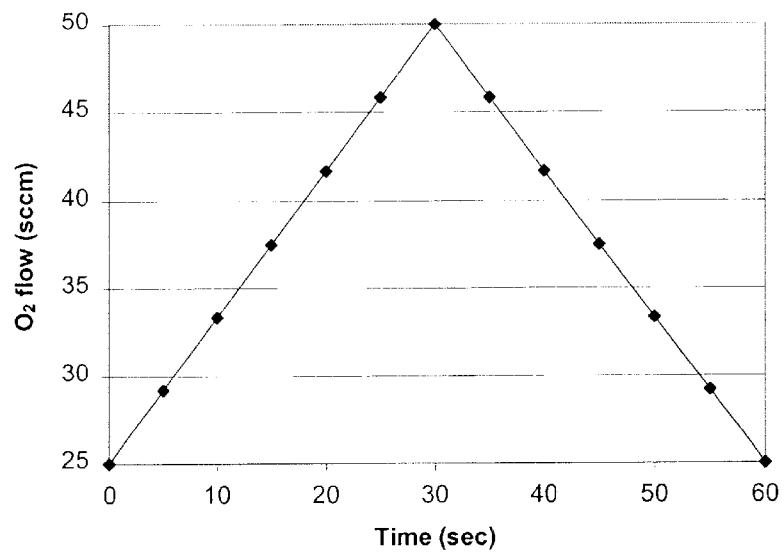

Embodiments of the present invention include etching the non-homogenous layer with an etchant having a reactive agent by continuously increasing or decreasing the concentration of the reactive agent in the etchant. The following examples are provided for etching a silicate glass layer having varying concentrations of carbon from top to bottom and changing the flow of oxygen to the etchant composition, as illustrative of the present invention FIG. 2A illustrates a linear increase of added oxygen during a 50 second etching time where the flow of oxygen starts at 25 sccm and changes continuously and linearly by an empirically determined factor per second to end at a final flow rate of 50 sccm. The following equation summaries a linearly changing amount of added active agent by way of illustrating the amount of oxygen that can be added during the etching of a non-homogenous organosilicate layer:

$$O_2(\text{flow at sccm}) = 25 + 0.5t \tag{1}$$

where $O_2$ is oxygen and t is time in seconds. FIG. 2B illustrates continuously increasing and then continuously decreasing the concentration of the agent. In the initial 30 second of etching, the flow of oxygen can be described by equation (2a) while the remaining 30 seconds of etching can be summarized by equation (2b)

$$O_2(\text{flow at sccm}) = 25 + 0.833t \tag{2a}$$

$$O_2(\text{flow at sccm}) = 50 - 0.833t \tag{2b}$$

where $O_2$ is oxygen and t is time in seconds.

Figure 3A:
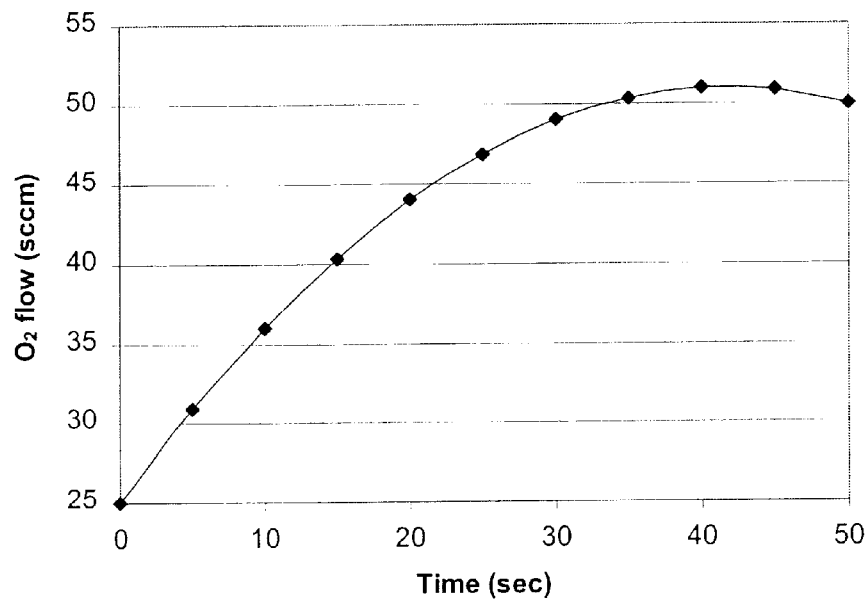
Figure 3B:
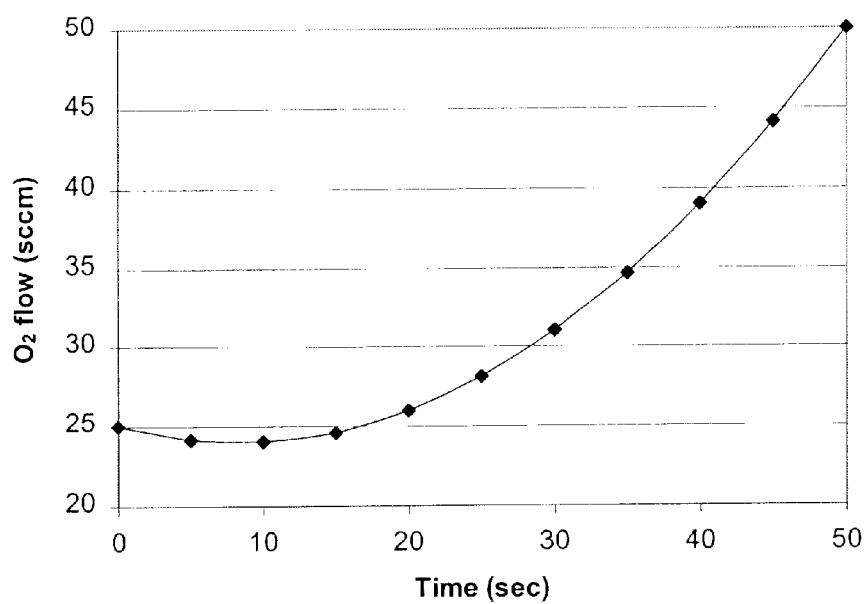
Figure 4:
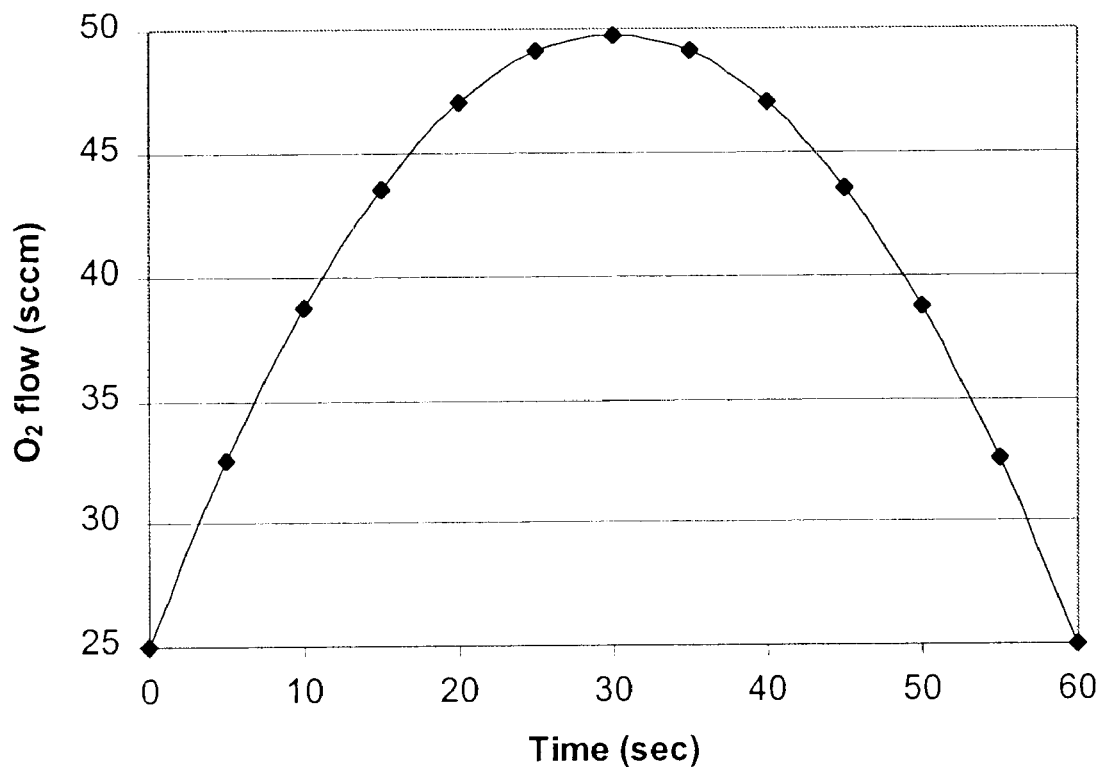

Nonlinear variation of oxygen with an initially faster increase can be summarized by equation (3) and a nonlinear variation of oxygen with an initially slower increase can be summarized by equation (4) and are illustrated in FIGS. 3A and 3B respectively:

$$O_2(\text{flow at sccm}) = -0.015t^2 + 1.25t + 25 \tag{3}$$

$$O_2(\text{flow at sccm}) = 0.015t^2 - 0.25t + 25 \tag{4}$$

where $O_2$ is oxygen and t is time in seconds. FIG. 4 graphically illustrates adding an active agent by a nonlinear continuously increasing and then a nonlinear continuously decreasing fashion and can be summarized by equation (5).

$$O_2(\text{flow at sccm}) = -0.0275t^2 + 1.65t + 25 \tag{5}$$

where $O_2$ is oxygen and t is time in seconds. Although the above equations initiate the flow of oxygen at 25 sccm and end at 50 sccm, it may be advantageous to start at a lower flow rate (even with an initial zero flow rate) and end at a flow rate other than 50 sccm.

Upon complete etching of the dielectric material, a damascene type interconnect can be formed by removing the photoresist layer and depositing a metal into the etched opening (i.e. a via or trench). The interconnect metal can comprise a number of conventional metals including Al, Al alloys, Cu, Cu alloys and W. Cu and Cu alloys are preferred because of the high conductivity of Cu and its alloys. However, Cu is prone to diffusion in silicon based ILD. Therefore, when a metal comprising Cu is used as the interconnect, a barrier layer is first deposited on the dielectric film. Suitable conductive Cu barrier layers include Ta, TaN, Ti, TiN, and WN. After metal deposition, the semiconductor device is planarized, as by a chemical-mechanical polishing technique (CMP) to remove the metal overfill and the conductive barrier layer.

The method of forming a semiconductor device, as described herein, provides an economical and reliable process of etching a non-homogenous layer. The manipulative steps and structures previously described do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

While this present invention has been described in connection with what is presently considered to be the most practical and preferred embodiments, it is to be understood that the present invention is not limited to the disclosed embodiments, but, on the contrary, is intended to cover various modifications and equivalent arrangements included within the spirit and scope of the appended claims.

What is claimed is:

1. A method of etching a non-homogenous layer on a semiconductor substrate, the method comprising:
    forming a non-homogenous layer having a varying concentration of at least one component through the layer on the semiconductor substrate, wherein the non-homogenous layer comprises a multi-layered dielectric layer that is formed by depositing a lower layer of an organic doped silica glass on the semiconductor substrate; depositing a middle layer comprising a mixture of a fluorine doped silica glass and gradually increasing the concentration of carbon to form a higher carbon content upper layer of the silica glass; and
    etching the non-homogenous layer with an etchant having a reactive agent by continuously varying at least one process parameter.

2. The method of claim 1, comprising continuously varying the concentration of the reactive agent in the etchant to correspond to the concentration of the at least one component in the layer as the varying process parameter.

3. The method of claim 2, comprising forming a silicate glass layer having a varying carbon concentration through the layer as the non-homogenous layer and etching the non-homogenous layer with an etchant comprising a fluorinated organic, oxygen and an inert gas.

4. The method of claim 3, comprising varying the concentration of oxygen in the etchant during etching to correspond to the varying concentration of carbon through the non-homogenous layer.

5. The method of claim 4, comprising forming the non-homogenous layer on a conductive layer and etching a via or trench in the non-homogenous layer.

6. The method of claim 2, comprising continuously increasing and then continuously decreasing the concentration of the reactive agent.

7. The method of claim 2, comprising continuously and linearly varying the concentration of the reactive agent.

8. The method of claim 2, comprising continuously increasing the concentration of the reactive agent.

9. A method of etching a composite layer comprising a conductive layer and a silicon oxide film thereon, the method comprising:
    forming a silicon oxide film having a varying concentration of carbon through the film;
    forming a layer of photoresist material on the silicon oxide film;
    patterning the photoresist layer to form a photoresist mask having at least one opening; and
    using the photoresist mask, etching the silicon oxide film with an etchant having a reactive agent by continuously varying the concentration of the reactive agent in the etchant to correspond to the concentration of the carbon through the film during etching.

10. The method of claim 9, comprising etching the silicon oxide film with an etchant comprising a mixture containing a fluorinated organic, oxygen and an inert gas.

11. The method of claim 10, comprising continuously varying the concentration of oxygen during etching the silicon oxide film.

12. The method of claim 9, comprising increasing then decreasing the concentration of the reactive agent during etching.

13. The method of claim 9, comprising continuously and linearly varying the reactive agent concentration.

* * * * *